United States Patent
Lee et al.

(10) Patent No.: US 6,597,622 B2
(45) Date of Patent: Jul. 22, 2003

(54) APPARATUS AND METHOD FOR OPERATION OF MULTI-BANK SEMICONDUCTOR MEMORY DEVICE WITH AN UP/DOWN COUNTER

(75) Inventors: Joo-Sang Lee, Seoul (KR); Jong-Hoon Park, Kyungki-Do (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 0 days.

(21) Appl. No.: 10/046,174

(22) Filed: Jan. 16, 2002

(65) Prior Publication Data

US 2002/0093869 A1 Jul. 18, 2002

(30) Foreign Application Priority Data

Jan. 16, 2001 (KR) .......................... 2001/2391

(51) Int. Cl.[7] .................................. G11C 8/00
(52) U.S. Cl. ............. 365/230.03; 365/236; 365/189.09; 365/203
(58) Field of Search .................. 365/230.03, 236, 365/189.09, 189.11, 230.06, 203; 327/530; 326/88

(56) References Cited

U.S. PATENT DOCUMENTS 6,072,747 A * 6/2000 Yoon ..................... 365/230.06

* cited by examiner

*Primary Examiner*—David Lam
(74) *Attorney, Agent, or Firm*—Birch, Stewart, Kolasch & Birch, LLP

(57) ABSTRACT

A multi-bank semiconductor memory device includes a multi-bank memory; a voltage generator having one standby driving circuit and a plurality of active driving circuits and supplying a power source voltage required for a semiconductor device; and, an up/down counter for counting a low access signal and a low precharge signal and outputting a multi-bit driving enable signal for driving the plurality of active driving circuits differentially in performing an interleaving operation. When a plurality of banks are accessed, the number of banks being currently accessed is counted by using the low access signal and the low precharge signal. The number of the voltage driving circuits is increased and decreased according to the count value.

17 Claims, 2 Drawing Sheets

APPARATUS AND METHOD FOR OPERATION OF MULTI-BANK SEMICONDUCTOR MEMORY DEVICE WITH AN UP/DOWN COUNTER

BACKGROUND OF THE INVENTION

1. Field of the Invention

The present invention relates to a semiconductor memory device, and more particularly, to a multi-bank semiconductor memory device that is capable of varying a driving capability of a voltage driving circuit according to the number of accessed banks.

2. Description of the Background Art

As shown in FIG. 1, a conventional multi-bank semiconductor memory device includes a memory 10 having 16 banks, two bank address decoders 12 and 14, a controller 16 and a voltage generator 18.

The bank address decoder 12 decodes active bank addresses ABA0~ABA3 and generates bank precharge signals BAC0–BAC15. The bank address decoder 14 decodes precharging bank addresses PBA0~PBA3 and generates bank precharge signals BPR0–BPR15.

RACC and RPRE respectfully correspond to a low access signal and a low precharge signal, which are RAS signals of DRAM. That is, the RACC performs the same function as a negative edge of the RAS signal, and the RPRE performs the same function as a positive edge of the RAS signal.

The controller 16 receives bank access signals BAC0~BAC15 and BPR0–BPR15 outputted from the two bank address decoders 12 and 14, and a driving enable signal DREN for driving the voltage generator 18 according to the bank precharge signals BPR0~BPR15.

As shown in FIG. 2, the controller 16 includes a plurality of latches (LAT1~LATn) and one AND gate AD1. An initial state of the latches (LAT1~LATn) is determined by a power up (PWRUP) signal.

The voltage generator 18 generates every power supply voltage VDD required for a memory device and includes one standby driving circuit 18-1 and a plurality of active driving circuits 18-2~18-n The standby driving circuit 18-1 is continuously operated, while the active driving circuits 18-2~18-n are operated according to the driving enable signal DREN outputted from the controller 16.

The operation of the multi-bank semiconductor memory device of the conventional art constructed as described above will now be explained.

Two bank address decoders 12 and 14 are synchronized by the low access signal RACC or the low precharge signal RPRE and decode an inputted bank address. Then, the two bank address decoders 12 and 14 generate bank access signals BAC0~BAC15 and bank precharge signals BPR0~BPR15, respectively.

That is, in reading/writing operations of the memory 10, the bank address decoder 12 decodes the bank addresses ABA0~ABA3 synchronized with the low level low access signal RACC and outputs the bank access signals BAC0~BAC15 to the controller 16.

Meanwhile, in precharging of the memory 10, the bank address decoder 14 decodes the bank addresses PBA0~PBA3 synchronized with the high level low precharge signal RPRE and outputs bank precharge signals BPR0~BPR15 to the controller 16.

The controller 16 receives the bank addresses ABA0~ABA3 or the bank precharge signals BPR0~BPR15 of each bank, and generates the driving enable signal DREN for driving the voltage driving circuits 18-2~18-n of the voltage generator 18.

Namely, the controller 16 includes latches LAT1~LATn indicating whether 16 banks are accessed or precharged and an AND gate AD1 for generating the driving enable signal DREN when at least one bank is accessed.

When an access signal of a specific bank is inputted, the controller 16 sets the latch, and conversely, when a precharge signal is inputted, the controller resets the latch. At this time, the power-up (PWRUP) signal serves to reset the initial state of the latches LAT1~LATn.

Accordingly, during an interleaving operation, since a plurality of banks are accessed, the latches LAT1~LATn are set according to the number of accessed as banks. That is, the number of set latches indicates the number of banks currently performing an interleaving operation.

The voltage generator 18 operates every active voltage driving circuit 18-2~18-n according to the driving enable signal DREN outputted from the controller 16 and generates a power supply voltage VDD required for the memory device. At this time, the standby driving circuit 18-1 is operated all the time.

The conventional multi-bank semiconductor memory device, however, has the following problems.

That is, first, the bank addresses ABA and PBA inputted in synchronization with the low access signal RACC or the low precharge signal RPRE are decoded by the respective bank address decoder 12 or 14 and inputted to the controller 16. Accordingly, a delay time occurs before the driving enable signal DREN of the voltage generator 18 is generated. Such time delay causes delay in the response of the voltage generator 18, causing an unstable operation of the memory.

Second, as the number of banks is increased in the memory 10, the bank addresses decoded by the bank address decoders 12 and 14 are increased to cause a problem that a routing area is enlarged.

Third, as the number of banks of the memory 10 is increased, the number of logic gates in the controller 16 and the input number of the logic gates are increased. Then, a lay-out area of the controller 16 is accordingly increased, serving as a factor delaying generation of the driving enable signal DREN.

Fourth, since the voltage driving circuits included in the voltage generating circuit are divided into two types of circuits including a standby circuit and an active circuit, if the number of banks for performing an interleaving operation is increased, it is difficult to suitably cope with it. The reason for this is that the number of the active driving circuits should be increased according to the number of the banks for performing the interleaving operation.

Fifth, if even one bank of the voltage generating circuit is accessed, every active driving circuit is operated. Thus, power is unnecessarily consumed.

SUMMARY OF THE INVENTION

Therefore, an object of the present invention is to provide a multi-bank semiconductor memory device that is capable of varying a driving capability of a voltage generator according to the number of active banks.

Another object of the present invention is to provide a multi-bank semiconductor memory device that is capable of stably operating a memory by increasing a response speed of the voltage generator.

A further object of the present invention is to provide a multi-bank semiconductor memory device that is capable of almost constantly maintaining a lay-out area regardless of the number of banks performing an interleaving.

Still another object of the present invention is to provide a multi-bank semiconductor memory device that is capable of optimizing a power consumption by varying the number of active driving circuits according to the number of active banks.

To achieve these and other advantages one embodiment of the invention includes a semiconductor device including a memory having memory banks and generating a first signal and a second signal; a voltage generator having a plurality of driving circuits and generating a power required for operation of the semiconductor memory device; and, a counter for receiving a first signal and a second signal and generating a count value and a corresponding driving signal for driving a first number of active driving circuits of the plurality of driving circuits such that the first number of active driving circuits is variable.

The counter counts the first signal and the second signal to generate the drive signal. Also, when a number of memory banks N of the memory banks in the memory are active, the driving signal has a value of logN bit. Further, the first signal is a low access signal, and the second signal is a low pre-charge signal.

The first number of active driving circuits may be equal to the count value determined by the counter. Also, the first number of active driving circuits may be sequentially driven according the count value determined by the counter. On the other hand, the first number active driving circuits may be variably driven according the count value determined by the counter.

In a second embodiment, a semiconductor device includes a multi-bank memory providing a first signal and a second signal; a voltage generator having a plurality of active driving circuits and generating a power required for the semiconductor device; and, an up/down counter for counting the first signal and the second signal and generating a multi-bit driving signal to drive a variable number of the active driving circuits.

The first signal is a low access signal and the second signal is a low pre-charge signal and generates a drive signal. Also, when the maximum number of banks performing an interleaving is 'N', the drive signal may have a value of log N bit.

The active driving circuits may be sequentially driven according to a count value of the up/down counter. Also, the active driving circuits may be variably driven according to a count value of the up/down counter.

In a third embodiment, a method of operating a multi-bank semiconductor memory device includes outputting a first signal and a second signal from a multi-bank memory wherein the first signal and the second signal representing at least one active memory bank in the memory. A count value and corresponding driving signal are generated by counting the first signal and the second signal. Also, a number of active circuits are driven in a voltage generator for a semiconductor memory device using the driving signal such that the number of active circuits is variable.

Further, the step of driving the number of active driving circuits may include variably driving the number active driving circuits according the count value. On the other hand, the step of driving the number of active driving circuits may include sequentially driving the number of active driving circuits according to the count value. Further, the step of driving the number of active driving circuits may include driving a first number of active driving circuits that is equal to the count value determined by an up/down counter.

Lastly, the step of generating a count value and corresponding driving signal may be performed by an up/down counter.

These and other objects of the present invention will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE FIGURES

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 3:
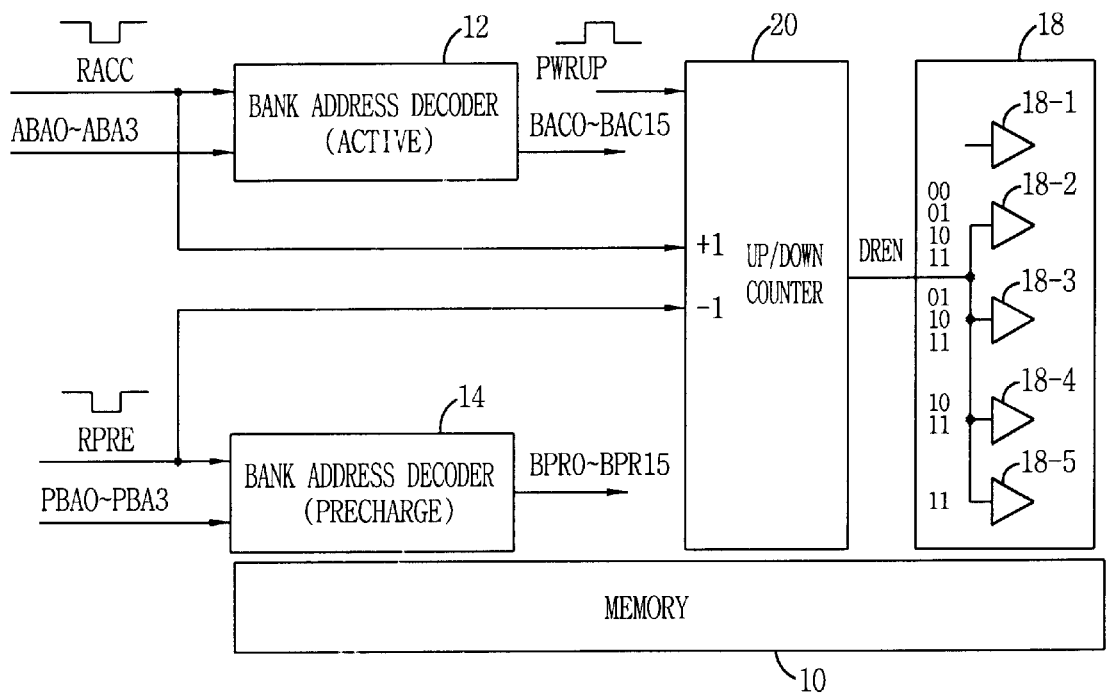
FIG. 3 is a schematic block diagram of a multi-bank semiconductor memory device in accordance with a preferred embodiment of the present invention.

FIG. 3 is a schematic block diagram of a multi-bank semiconductor memory device in accordance with a preferred embodiment of the present invention.

Figure 1:
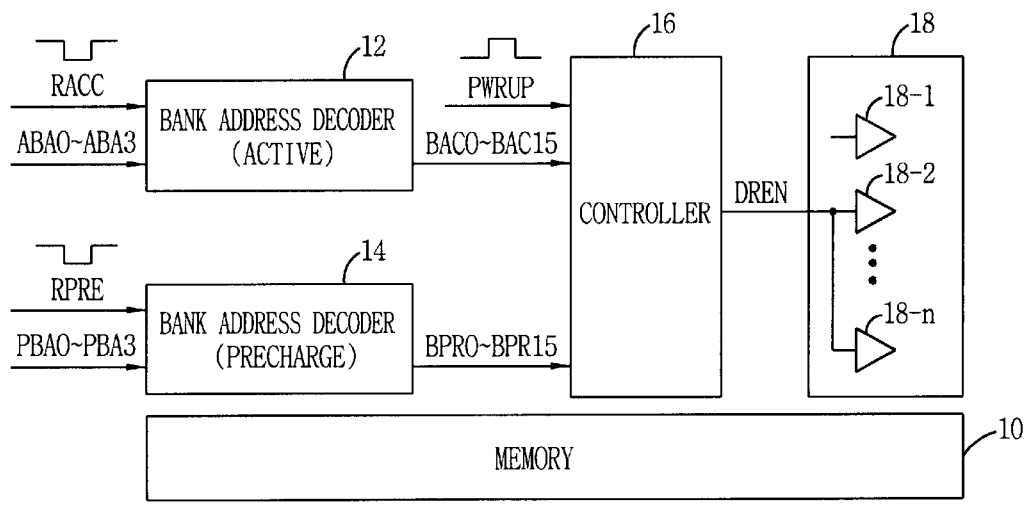
FIG. 1 is a schematic block diagram of a multi-bank semiconductor memory device in accordance with a conventional art.
Figure 2:
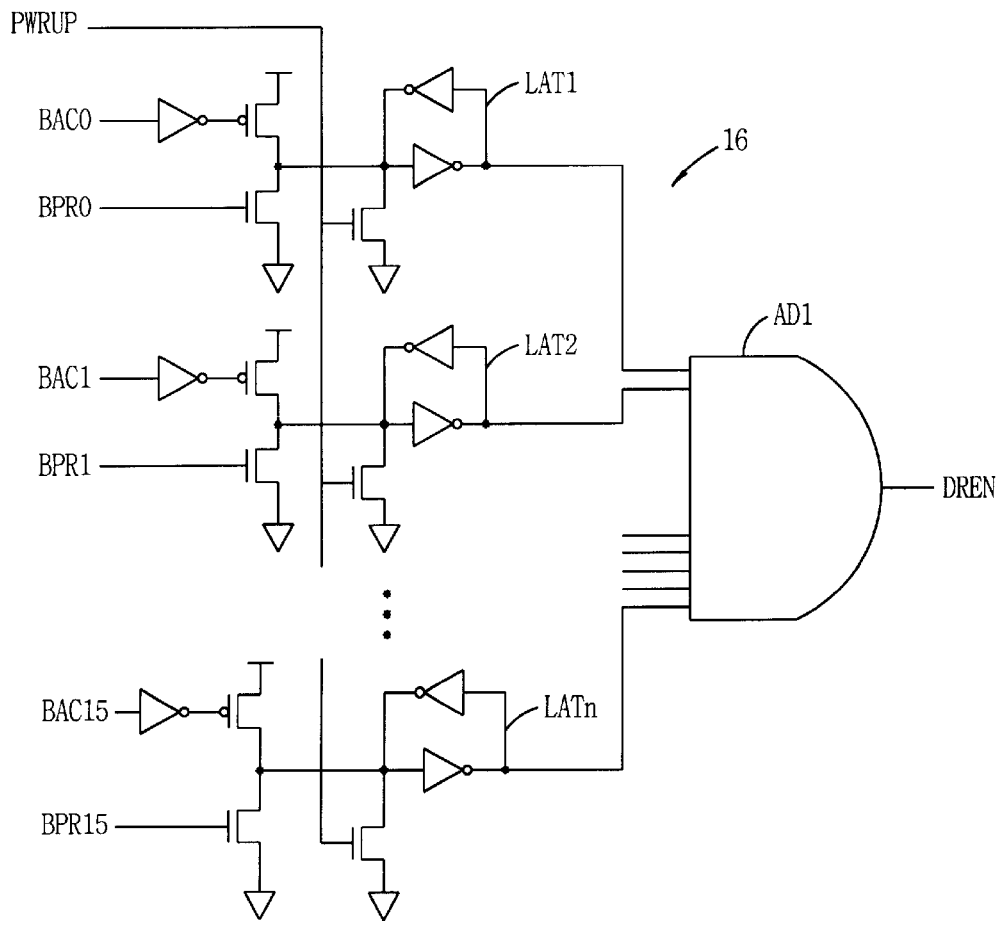
FIG. 2 depicts a detailed construction of a voltage generator of FIG. 1 in accordance with the conventional art.

As shown in FIG. 3, a multi-bank semiconductor memory device is implemented by substituting the controller 16 of the conventional art with a bit up/down counter 20. Also, a low access signal RACC and a low pre-charge signal RPRE are used as inputs for the up/down counter 20. In other words, such bank access signals BAC0~BAC15 and bank pre-charge signals BPR0~BPR15, as shown in FIG. 1 and used in the conventional art are not required.

Figure 4:
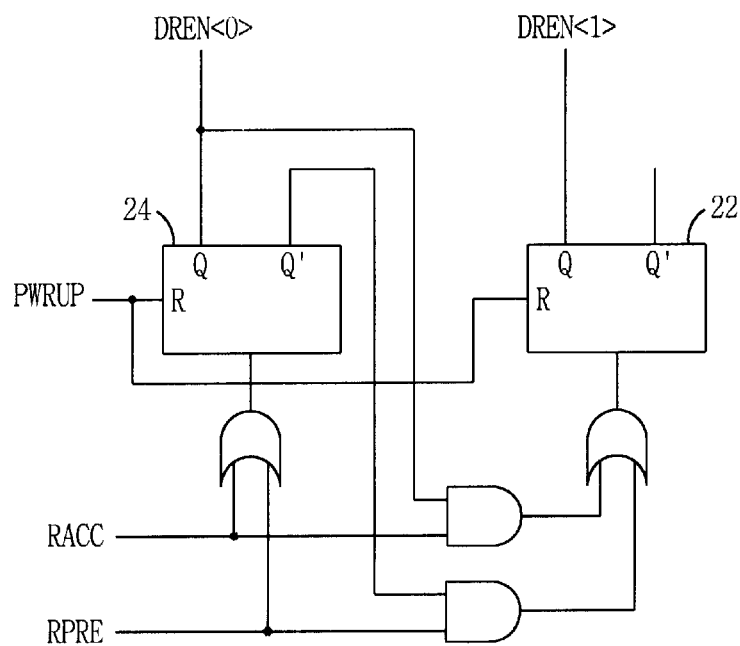
FIG. 4 is a circuit diagram of a 2-bit up/down counter of FIG. 3 in accordance with the preferred embodiment of the present invention.

FIG. 4 is a circuit diagram of a 2-bit up/down counter of FIG. 3 adopting two T flipflops 22 and 24 in accordance with the preferred embodiment of the present invention. The up/down counter 16 generates a multi-bit enable signal.

The multi-bit enable signal DREN outputted from the up/down counter 20 indicates the number of banks which are currently being accessed.

Accordingly, assuming that the maximum number of banks for performing an interleaving is 'N', only a log N-bit up/down counter and log N bit DREN signal are used. In other words, when interleaving occurs in 4 banks, the voltage generator 18 is driven by using 2-bit up/down counter and 2-bit DREN signal.

FIG. 3 also depicts the voltage generator 18, which includes one standby driving circuit 18-1 and a plurality of active driving circuits 182-2~18-n. The number of active voltage driving circuits 18-2~18-n is increased or decreased according to a multi-bit enable signal DREN. As a result, the number of active driving circuits will correspond to the number of active banks.

The operation of the multi-bank semiconductor memory device constructed as described above will now be explained with reference to FIGS. 3 and 4.

When a low access signal RACC is inputted, the up/down counter 20 increases a count value by '1'. On the other hand, when a low pre-charge signal RPRE is inputted, the up/down counter 20 reduces the count value by '1'.

The multi-bit enable signal DREN outputted from the up/down counter 20 indicates the number of banks being currently accessed, which is the number of banks performing an interleaving.

Thus, since the voltage generator 18 operates a different number of active driving circuits according to the bit value of the multi-bit enable signal DREN outputted from the up/down counter 20, the power source voltage required for operation of the memory is supplied in only as much as required. In other words, when the bit value of the driving enable signal DREN is '00', the voltage generator 18 operates only one active driving circuit 18-2, while, if the bit value is '01', the voltage generator 18 operates two active driving circuits 18-2 and 18-3.

In the same manner, if a count value is '10', the voltage generator 18 operates three active driving circuits 18-2~18-4. Further, if a count value is '11', the voltage generator 18 operates four active driving circuits 18-2~18-5.

In addition, in the same manner, the voltage generator 18 can reduce the number of active driving circuits 18-2~18-5 which are being currently operated according to the multi-bit driving enable signal DREN.

The up/down counter 20 is not limited to 2 bits and is variable depending on the number of the voltage driving circuits. Further, the construction logic of the up/down counter can be arbitrarily implemented.

Also, the operation of the up/down counter can vary. For example, the up/down counter can be implemented only to perform an operation of increasing a count value by '1' when a PWRUP signal is reset and a low access signal RACC is inputted, and perform an operation of reducing a count value by '1' if only a low precharge signal RPRE is inputted. Logic circuitry of the up/down counter may also vary. For example, the up/down counter may be implemented by using a JK flipflop or other suitable logic circuitry known in the art.

The method for controlling the number of active voltage driving circuits of the voltage generator with the driving enable signal of driving multi-bit memory may also vary and can be arbitrarily performed. That is, it is not necessary to increase the active voltage driving circuits only one by one, as illustrated in FIG. 3, and the number is varied as necessary.

As so far described, the multi-bank semiconductor memory device of the present invention has many advantages.

For example, when a plurality of banks are accessed, the number of banks being currently accessed or performing an interleaving operation is counted by using the low access signal and the low pre-charge signal. Further, the number of the voltage driving circuits can be increased and decreased according to the number banks being accessed. As a result, the unnecessary voltage supply for a low access operation as used in the conventional art is restrained.

Second, since only the low access signal and the low pre-charge signal are used, unlike in the conventional art, no time delay occurs for decoding the bank address. Consequently, the response speed of the voltage generator becomes relatively fast, so that a stable operation of the memory is ensured.

Third, even though the number of banks performing an interleaving is increased as the number of banks is increased, the area of the up/down counter is not enlarged much relatively. Especially, since the input of the up/down counter is only the low access signal and the low pre-charge signal, an area for routing is not necessary. So, even though the number of banks is increased, assuming that the maximum number of banks performing an interleaving is 'N', only a log N-bit up/down counter need be constructed.

Fourth, since the power source voltage used for operation of the memory is supplied as much as required by increasing or decreasing the number of the driving circuits of the voltage generator according to the number of active banks, a power consumption can be optimized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a memory having memory banks and generating a first signal and a second signal;
   a voltage generator having a plurality of driving circuits and generating a power required for operation of the semiconductor device; and
   a counter for receiving a first signal and a second signal and generating a count value and a corresponding driving signal for driving a first number of active driving circuits of the plurality of driving circuits such that the first number of active driving circuits is variable.

2. The device of claim 1, wherein
   the counter counts the first signal and the second signal to generate the drive signal.

3. The device of claim 1, wherein
   a second number of memory banks N of the memory banks in the memory are active, and
   the driving signal has log N bits.

4. The device of claim 1, wherein,
   the first signal is a low access signal, and
   the second signal is a low pre-charge signal.

5. The device of claim 1, wherein
   the first number of active driving circuits is equal to the count value determined by the counter.

6. The device of claim 1, wherein
   the first number active driving circuits is sequentially driven according the count value determined by the counter.

7. The device of claim 1, wherein
   the number active driving circuits is variably driven according the count value determined by the counter.

8. A semiconductor device comprising:
   a multi-bank memory providing a first signal and a second signal;

a voltage generator having a plurality of active driving circuits and generating a power required for the semiconductor device; and an up/down counter for counting the first signal and the second signal and generating a multi-bit driving signal to drive a variable number of the active driving circuits.

9. The device of claim 8, wherein the first signal is a low access signal and the second signal is a low precharge signal.

10. The device of claim 8, wherein the maximum number of banks performing an interleaving is 'N', and the drive signal has a value of log N bit.

11. The device of claim 8, wherein the active driving circuits are sequentially driven according to a count value of the up/down counter.

12. The device of claim 8, wherein the active driving circuits are variably driven according to a count value of the up/down counter.

13. A method of operating a semiconductor device, said method comprising the steps of:

outputting a first signal and a second signal from a multi-bank memory, the first signal and the second signal representing at least one active memory bank in the memory;

generating a count value and corresponding driving signal by counting the first signal and the second signal; and driving a number of active circuits in a voltage generator for the semiconductor device using the driving signal such that the number of active circuits is variable.

14. The method of claim 13, wherein the step of driving the number of active driving circuits includes variably driving the number active driving circuits according the count value.

15. The method of claim 13, wherein the step of driving the number of active driving circuits includes sequentially driving the number of active driving circuits according to the count value.

16. The method of claim 13, wherein the step of driving the number of active driving circuits includes driving a firs t number of active driving circuits that is equal to the count value determined by an up/down counter.

17. The method of claim 13, wherein, the step of generating a count value and corresponding driving signal is performed by an up/down counter.

* * * * *